United States Patent [19]
Anthony

[11] Patent Number: 5,142,430
[45] Date of Patent: Aug. 25, 1992

[54] POWER LINE FILTER AND SURGE PROTECTION CIRCUIT COMPONENTS AND CIRCUITS

[76] Inventor: Anthony A. Anthony, 2308 Hampton Rd., Erie, Pa. 16502

[21] Appl. No.: 500,754

[22] Filed: Mar. 28, 1990

[51] Int. Cl.⁵ .............................................. H02H 9/04
[52] U.S. Cl. ...................................... 361/56; 361/111; 361/127
[58] Field of Search .................... 361/56, 91, 111, 58, 361/119, 118, 127, 113

[56] References Cited

U.S. PATENT DOCUMENTS

| | | | |
|---|---|---|---|
| 3,742,420 | 6/1973 | Harnden, Jr. | 338/13 |
| 4,394,639 | 7/1983 | McGalliard | 361/104 |
| 4,924,340 | 5/1990 | Sweet | 361/56 |

*Primary Examiner*—Todd E. Deboer
*Attorney, Agent, or Firm*—Oldham, Oldham & Wilson Company

[57] ABSTRACT

The invention is directed to power line filter and surge protection circuit components and the circuits in which they are used to form a protective device for electrical equipment. The circuit components comprise wafers or disks of material having desired electrical properties such as varistor or capacitive characteristics. The disks are provided with electrode patterns on surfaces thereof which coact with apertures formed therein so as to electrically connect the components to electrical conductors of a system easily and effectively. The electrode patterns act in conjunction with one another to form common electrodes with the material interposed therebetween. The electrode patterns are optimized in the circuit components such that balanced protection is achieved over all electrical conductors. The components also eliminate the use of leads such that operating characteristics are improved significantly. The invention provides an easily manufactured and cost effective construction usable in a variety of applications.

20 Claims, 4 Drawing Sheets

POWER LINE FILTER AND SURGE PROTECTION CIRCUIT COMPONENTS AND CIRCUITS

BACKGROUND OF THE INVENTION

The present invention relates to an electrical surge protection device in conjunction with a filter for filtering electromagnetic interference (EMI) or radio frequency interference (RFI). More particularly, the invention relates to a phase balanced surge protection and filtering device which may be used to protect sensitive electronic or electromechanical equipment from electromagnetic pulse EMP, transient surges or EMI wherever differential or common mode protection would be required or where cross line protection is required. Additionally, the invention may be used by electronic equipment manufacturers to comply with various regulatory requirements related to electromagnetic susceptibility and emissions or the like created by such equipment.

The majority of electronic equipment produced presently, and in particular computers, communication systems, military surveillance equipment, stereo and home entertainment equipment, televisions and other appliances include miniaturized components and electrical contacts which according to the materials from which they are made or their mere size are very susceptible to stray electrical energy created by electromagnetic interference or voltage transients occurring on electrical lines. Voltage transients can severely damage or destroy such electronic components or contacts thereby rendering the electronic equipment inoperative, and requiring extensive repair and/or replacement at great cost.

Transient voltages occurring on electrical lines can be induced by lightning which produces extremely large potentials in a very short time. These potentials are transmitted via the electrical line to equipment coupled thereto. In a similar manner, extremely detrimental transients could be induced by electromagnetic energy created by a nuclear electromagnetic pulse EMP wherein intense transient electric and magnetic fields having very short rise times and large frequency spectrums are produced. Other sources of large voltage transients are found to be associated with voltage surges occurring upon the switching off or on of some electronic power equipment as well as ground loop interference caused by varying ground potentials.

Electrical interference in the form of EMI or RFI can be induced into electrical lines from such sources as radio broadcast antennas or other electromagnetic wave generators. Alternatively, another source of interference is found to be generated from equipment coupled to the electrical lines, such as computers, switching power supplies and a variety of other components, which may generate significant interference which is desired to be filtered.

Based upon the known phenomena of transient voltage surges and harmful electrical interference or noise, a variety of filter and surge suppression circuit configurations have been designed to filter EMI or RFI interference or suppress large transient voltages appearing on an electrical line. For example, in U.S. Pat. No. 4,760,485, ZnO surge arresters are utilized to replace existing capacitors in an electrical circuit having capacitive elements with values of up to approximately 100 nF. The ZnO surge arresters behave as capacitors at voltages less than their pick up voltage but would pass into a highly conductive state and limit the voltage after such pick up level has been attained. In this way, providing ZnO surge arresters in conjunction with a low pass filter in the manner of this invention will limit voltage surges, emissions and susceptibility as desired.

In U.S. Pat. No. 4,703,386, there is shown a power receptacle and an associated filter to limit EMI and RFI. The RFI/EMI filter is placed in series with an electrically isolated outlet of the power supply system to thereby protect the electronic equipment coupled to the isolated outlet. The filter includes a series of capacitors coupled to a pair of chokes which are in turn coupled to additional capacitors including a common mode bypass capacitor. The circuit essentially forms a low pass filter utilized to eliminate electromagnetic interference occurring at higher frequencies. The circuit may additionally include surge protection comprising three varistors wherein one varistor is coupled to each output terminal of the circuit for common mode protection.

In the above examples, electromagnetic interference filters may be modified to include some form of surge protection or both. The filter and surge protection circuitry may be incorporated into a device, such as a power supply, in order to provide noise reduction and surge protection. Although known filter circuits and/or surge suppression circuits may be easily incorporated into some electronic devices, many times the incorporation of standard circuit components with leads on a circuit board or the like may present problems due to the leads slowing the protective capabilities of the circuit and the bulk of the circuits or the cost thereof. In many situations, electronic devices are not manufactured with protective circuitry, and the user must provide adequate protection at the point of use of the electronic equipment.

Based upon the foregoing, there was found a need to provide point of use surge suppression or electromagnetic interference filtering which can be easily retrofit into the electronic equipment or placed external to the equipment and positioned between the power cables, data cables or other lines which may couple the equipment to a source of interference or possible voltage surges. In this respect, point of use protection devices have been developed as for example, in U.S. Pat. No. 4,794,485 which shows a voltage surge protector for suppressing transient surges at the location of an electrical outlet. The device mounts on the back side portion of an electrical outlet and includes surge protection components therein such as planar varistors which are interposed between the power source and the device to be coupled thereto.

In another example, as found in U.S. Pat. No. 4,720,760, electrical surge protection is provided by a ZnO non-linear resistor device which is in the form of a circular ZnO disk incorporated into a mains electrical plug. A transient overvoltage at any of the plug pins will be suppressed by break down of a respective one or more of the non-linear resistors so as to conduct the transient to ground. The non-linear resistor device is constructed as a disk of non-linear resistor material having a plurality of discrete first electrodes formed on one surface for cooperation with a second electrode formed on the other surface of the disk. In the configuration, the first electrodes are spaced apart from each other on one surface of the disk by a distance relative to the thickness of the disk so as to make the differential surge current conduction path through the disk to the second electrode thereon. Particularly, the first electrodes must be spaced apart by a distance at least equal to or greater than twice the thickness of the disk. The device is designed to produce a permanent short-circuit through the device between the respective pair of electrodes when a surge occurs across the ZnO varistor material disposed between the electrodes.

In another example, as found in U.S. Pat. No. 4,587,589, a voltage limiting feed-through device is disclosed which includes shunt elements connected between a conductor of the feed-through unit and a conducting wall through which the conductor passes. The shunt elements have first and second contact surfaces having a conducting coating and are formed from a varistor material such as ZnO. The construction provides a symmetrical configuration in order to guarantee an even thermal stress on the individual shunt elements in the event of a transient surge voltage. The voltage limiting feed-though units of this invention are suitable for use with conductors which serve to transmit relatively low frequency signals. This construction may be imbalanced with respect to the electrodes due to differences in the thicknesses or the dielectric constants of the shunt elements.

In all, although some point of use protective devices have been developed, a problem exists with enabling both electromagnetic interference and transient voltages to be effectively protected against using an inexpensive device which is both easily manufactured and handled. Additionally, transient overvoltage protection circuitry necessarily must be balanced between electrical lines in a multi-line system to preclude the possibility that a high voltage will be generated due to an unbalanced voltage potential across the lines in the circuit. Another problem with prior art constructions is that each electrical component in the circuit includes leads, wherein the lead lengths inherently will induce back EMF into the circuit and slow the clamping or filtering characteristics of the device. This problem would be increased by balancing the electrodes which would require additional leads.

It has therefore been found that a common electrode between possible elements to create such a balance is desirable. In this regard, there has been developed a three electrode surge arrester formed from a three terminal gas filled tube arrester. The gaps of the individual electrodes are within a single gas filled envelope and therefore tightly coupled such that breakdown of one gap leads to virtually simultaneous breakdown of the other two gaps within the gas filled tube. This gas filled tube arrester has been developed by Harmon Electronics, but has several deficiencies in that the circuit is relatively slow to recover and is bulky with labor intensive manufacture. Although the three electrode configuration creates the balance needed between lines in a system, these circuits do not have EMI suppression capabilities. Additionally, the construction is based upon reducing capacitance in the circuit which is contrary to suppressing EMI by maximizing capacitance.

It has also been found that conventional protective circuits which have attempted to provide surge protection and filtering normally would require more MOV material for higher overvoltages which adversely effects the capacitance value of the components. Generally, the prior art conditioning filters and pulse limiting circuits won't have sufficiently high capacitance as single sheets of material. Multilayer stacks of material which are monolithically fired to form a unit are known and can be used to form multilayer ceramic capacitors for example. Thus, to obtain the desired capacitance, the voltage potential across the component is reduced and the arrangement cannot be used is some high voltage applications. There is thus a need to provide a conditioning circuit arrangement wherein the desired capacitance values may be maintained for the filtering while increasing the voltages which will be effectively clamped by a surge protection device.

SUMMARY OF THE INVENTION

Based upon the foregoing, there has been found a need to provide a protective device which allows protection against electromagnetic interference, electromagnetic pulses and electrical surges which may tend to damage electrical and electromechanical instrumentation or equipment. For protection from surges, the device should be extremely fast in clamping the over voltage and also fast to recover. It is therefore a main object of the invention to provide an easily manufactured and adaptable circuit arrangement having line conditioning circuit components for point of use applications or circuit arrangements which can be retrofit or included in electrical and electromechnical instrumentation to provide protection therefore. The line conditioning circuit components include electrode patterns provided on the circuit elements wherein the electrode arrangement is optimized to avoid the use of any lead lengths and thereby minimize back EMF in the circuit as well as assembly labor. The components may be designed as multilayer assemblies which can be soldered or monolithically fired.

It is another object of the invention to provide a protective circuit arrangement which lends itself to be mass produced for various applications and is adaptable to include one or more protective circuit components into one circuit to provide protection against voltage transients, and electromagnetic interference.

It is yet another object of the invention to provide an electrical circuit construction which reduces assembly labor and handling and reduces the costs associated with providing line conditioning or protective circuitry for electrical equipment.

Another object of the invention is to provide circuits to protect sensitive electronic equipment from EMP, surges, lightening, or EMI wherever differential or common mode protection or cross line protection would be required.

Another object of the invention is to provide separate surge protection and filter circuit components which are easily used in conjunction with one another but maintain the conjunction with one another but maintain the necessary capacitance and also increase the voltage rating of the surge protection device.

These and other objects and advantages of the invention are accomplished by line conditioning circuit components and circuits in which these components are utilized to provide protection against transients and/or filtering. The line conditioning circuit components may be used in a circuit arrangement wherein they may be a first pair of terminals coupled in series between a load. The circuit arrangement may comprise at least one line conditioning circuit component made of a MOV or other MOV-type varistor material which is constructed as a flat plate or wafer having first and second parallel surfaces thereon. Electrode patterns are provided on the first and second surfaces thereof and includes apertures therethrough wherein the electrode surfaces will be electrically connected to the electrical conductors of the circuit. The novel electrode patterns of the invention in conjunction with the material making up the wafers produce commonality between electrodes for the electrical conductors, thereby producing a balanced circuit arrangement. Alternatively, or in conjunction with this type of line conditioning circuit component, a capacitor network may be constructed in a similar manner to provide flat plates or wafers of dielectric material. The capacitive network may be provided by fusing together thin film ceramics having pattern coated electrodes formed thereon such that in their stacked position the thin film ceramics will provide the desired capacitance to achieve various filtering effects. The circuit can additionally include an inductor or choke means which will further add filtering characteristics to the circuit.

Normally, intimacy or commonality between electrodes is not desirable as all conductors in a circuit are directly connected to the ground circuit. In the present invention, intimacy of electrodes is desirable as the line conditioning circuit components may be positioned very close to the incoming or outgoing electrical signals, for example at the location of a power plug or the like, so as to more effectively filter interference or the like. The construction of the various circuit components allow the surge protection and filtering networks to be formed in a simple and miniaturized manner to simply slip over conventional conductors provided on an electrical plug, power source, or other electrical circuit arrangement. All the circuit components may be grouped into one package and are simply and easily constructed into the final electrical or electromechanical equipment to reduce labor and construction costs as well as to provide a miniaturized and effective circuit arrangement. Additionally, the electrode arrangement is essentially leadless which reduces back EMF in the circuit and allows faster clamping and recovery while eliminating labor intensive wiring in the circuit. For the particular application, the thickness of the plates of varistor or dielectric materials may be modified easily to yield the desired amount of filtering and/or transient protection necessary. The particular construction also allows the capacitive and surge protection devices to be formed in the same small package construction to provide differential and common mode protection against surges and electromagnetic interference over a large frequency range.

BRIEF DESCRIPTION OF THE DRAWINGS

These and other objects and advantages of the invention will become apparent upon a reading of the following detailed description in conjunction with the Figures, wherein.

DETAILED DESCRIPTION OF THE INVENTION

Figure 1:
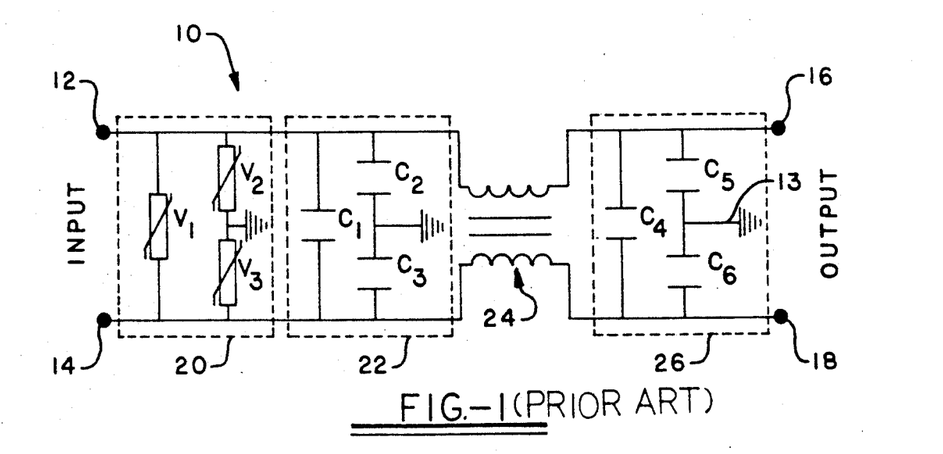
FIG. 1 shows a schematic circuit of a conventional filter circuit arrangement to provide filtering of electromagnetic interference.

Turning now to FIG. 1, a conventional protective circuit 10 is shown in schematic form and represents an interference filter with surge protection for an alternating current electrical network having a phase conductor indicated at terminal 12 and a neutral conductor at terminal 14 and a ground conductor shown at 13. The supply terminal 12, a neutral conductor terminal 14 may be coupled between a source of electromagnetic interference and the consumer side of the circuit having terminals 16 and 18. The circuit 10 may comprise sections 20, 22, 24 and 26 to provide various circuit characteristics. Circuit section 20 is related to surge protection circuitry and may comprise a plurality of surge arresters V1, V2, and V3 which may be surge arresters made of ZnO or other material having similar characteristics surge arresters. The surge arrester V1 is connected between phase conductor terminal 12 and neutral conductor 14 with varistors V2 and V3 also connected between the conductors in series and coupled to ground from a point therebetween. Circuit portion 22 is directed to a capacitive network to provide filtering characteristics for the circuit which may include a plurality of capacitors C1, C2 and C3 wherein capacitor C1 is a common mode bypass capacitor extending between the phase and neutral conductors and capacitors C2 and C3 are coupled to the phase and neutral conductor and to ground respectively. The capacitive network provides a low pass filter which rejects, or bypasses to ground the higher frequencies present in typically encountered RFI, EMI or EMC interference and compliance. An in line inductor or transformer 24 may be incorporated to provide a relatively high impedance to surge components so as to act as a transient or noise suppression component. Another capacitive network 26 similar to capacitive network 22 may include capacitive elements C4, C5 and C6 to provide additional noise suppression. The capacitive networks 22 and 26 may provide noise suppression of low frequency and high frequency noise depending upon the capacitance values chosen for the various capacitors in each of thee networks. On the output side of the circuit 10 are output terminals 16 and 18 which may be coupled to the consumer side of an electrical or electromechanical device.

In a circuit as found in FIG. 1, it has conventionally been the case that the circuit components have been separate and are physically coupled to the conductors of a power line, data line or the like. The conductors may be fed-through leads or leads to an individual element as desired. For example, the varistors as shown in the circuit FIG. 1 must be physically electrically coupled to the conductor post of a plug or the like by leads where the circuit is to be used. Similarly, individual capacitors of a capacitor network must be coupled to the inductors by leads to yield line to line capacitors as well as coupling terminals of the capacitors to ground. This manufacturing is labor intensive and is physically done in many circumstances yielding an inefficient and costly production procedure.

The present invention is direct to circuit construction which provides an easily produced protective circuit which is more responsive as well as being more cost effective. A protective circuit in accordance with the invention is shown schematically in FIG. 2 and comprises input conductors having terminals 30 and 32 being the phase and neutral conductors of an electrical plug or similar electrical coupling mechanism. A metal oxide varistor MOV network 34 is connected between the phase and neutral conductors to provide pulse protection. As will be described more particularly hereinafter, the MOV network is a wafer of MOV or MOV-type material having a unique electrode pattern enabling the circuit to be balanced over each line of the electrical system. This is achieved by a common electrode electrically coupling the phase, neutral and ground conductors in the system. This forms a balanced pulse protection circuit to provide differential, common mode or cross line protection.

Figure 2:
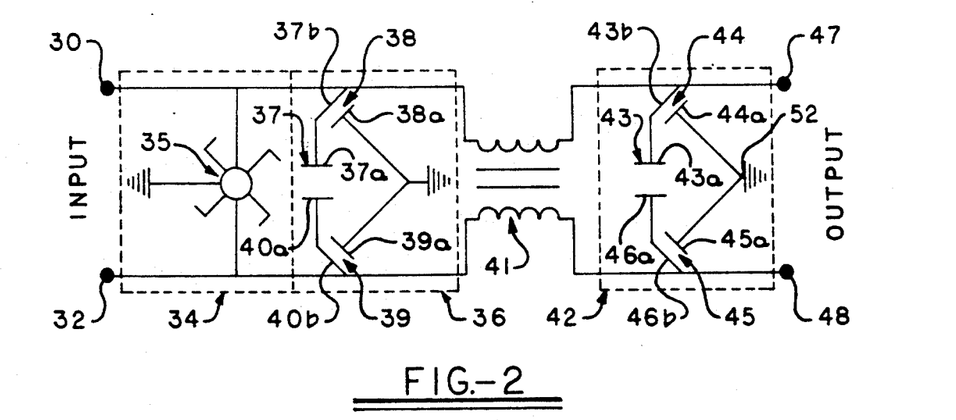
FIG. 2 shows a schematic of a phase balanced filter in accordance with the present invention to provide transient protection and filter electromagnetic interference.

The capacitance network 36 having a first capacitor 37 having capacitor plates 37a and 40a connected between the phase and neutral conductors. Also, formed in the network is a second capacitor 38 comprising plates 37b and 38a which is connected between the phase and ground conductors and a third capacitor 39 comprising plates 39a and 40b which is connected between the neutral and ground conductors. In the capacitance network, the capacitors include common electrodes wherein the commonality between electrodes is accomplished by forming the electrodes on a common disk or wafer. The common electrodes are represented as seen in FIG. 2 in contrast to the normal representation of capacitive elements similar to that found in FIG. 1. The electrodes or plates designated 37a and 37b as well as 40a and 40b are common electrodes formed as a single pattern on a disk of material. The separate functions are obtained by isolation of the mating patterns as will be hereinafter more fully described. The commonality of electrodes eliminates the need for leads and gives excellent response characteristics for a broad frequency band including relatively high frequencies and also achieves the desired balance in the circuit.

An in-line inductor 41 may be used in a similar capacity as that shown in the circuit of FIG. 1 with another capacitive network 42 following the inductor 41 to provide additional filtering characteristics. The capacitive network 42 may include a first capacitor 43 connected between the phase and neutral conductors and having electrodes or plates 43a and 46a. A second capacitor 44 is connected between the phase and ground conductors and comprises plates 43b and 44a. A third capacitor 45 is connected between the neutral and ground conductors and comprises plates 45a and 46b. As previously described, the electrodes or plates designated 43a and 43b as well as 46a and 46b are common electrodes formed as a single pattern on a disk of material. Output terminals 46 and 48 will be available on the consumer side of the circuit with pulse protection and electromagnetic interference filtering achieved by the circuit.

Figure 3:
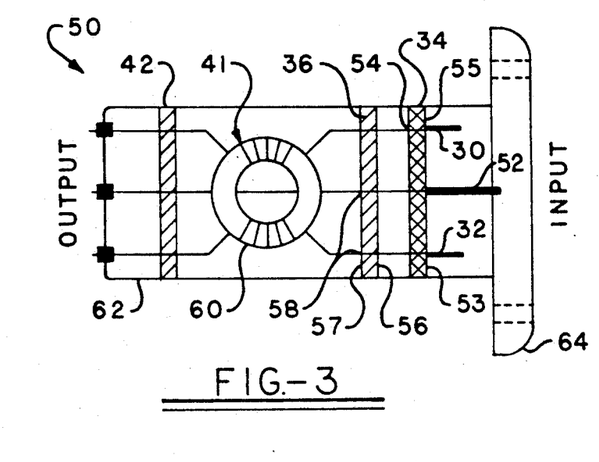
FIG. 3 shows an enlarged and simplified view of the circuit arrangement shown in FIG. 2 associated with a power outlet usable with electrical and electromechanical devices.
Figure 4:
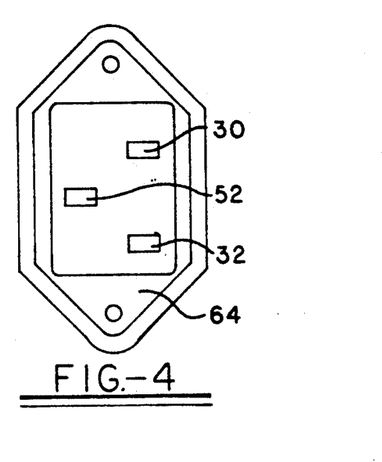
FIG. 4 shows a front view of the electrical outlet shown in FIG. 3.

As seen in FIGS. 3 and 4, one application of the circuit as seen in FIG. 2 is shown in simplified form. FIG. 3 shows an electrical mains plug receptacle which may be used to connect electrical equipment susceptible to degradation from transients or electromagnetic interference from a power source.

The plug receptacle 50 is shown as including the circuit elements as seen in FIG. 2 wherein identical reference numerals have been used to indicate the general components thereof. The plug receptacle 50 includes a phase conductor 30 and neutral conductor 32 as well as a ground conductor 52 utilized to connect a typical electrical device such as computer or the like. The plug receptacle 50 may be utilized to replace a conventional plug outlet and may be coupled to a source of AC power in a conventional and simple manner. The MOV network 34 to provide pulse protection is seen as a first flat plate or wafer constructed in the preferred embodiment of a varistor material such as MOV material, encapsulated polymer MOV-type material or other materials having similar characteristics. The wafer 34 of pulse protective material will include at least first and second parallel surfaces 53 and 54 which have conductive coatings thereon as will be more particularly described hereinafter. The plate or wafer 34 also includes apertures 55 therein through which the conductors 30, 32 and 52 will pass. The conductors will be electrically coupled to the conductive coatings on the surfaces of wafer 34 to provide pulse protection for the electrical equipment coupled thereto. It should be recognized that the varistor network 34 to provide pulse protection will be simply slipped over the terminals or conductors after which electrical connection can be quickly and easily made by a soldering process, a mechanical fastening arrangement or the like. This will eliminate the use of lead wires to couple the circuit components to conductors 30, 32 and 52 as well as to other circuit components. It should be evident that the labor intensive aspects of the prior art are eliminated to provide an easy and cost effective method of manufacturing. Similarly, as the wires between the electrical components of the circuit have been eliminated, UL standards such as maintaining a proper distance between wires for safety have also been eliminated such that spacing does not need to be checked and quality assurance is automatically incorporated into the construction. With this system, automation of the manufacturing techniques is possible thereby greatly reducing the time and effort needed to construct such circuits. Similarly, as the circuit components have been consolidated onto a simple wafer of material, the entire circuit construction can be miniaturized to provide the desired high speed circuit protection characteristics in an easily handled configuration.

After the varistor network 34, a capacitor network 36 is constructed in a similar manner and constitutes a wafer or plate of material such as ceramic having dielectric characteristics to produce the desired capacitance values. As will be hereinafter described, the capacitive network 36 will include first and second faces 56 and 57 on which electrode patterns will be formed. In the normal circumstance, the desired capacitance value may be obtained by stacking a plurality of thin film ceramics having electrode patterns formed thereon which coact with one another to achieve the desired capacitance. Again, apertures 58 are provided in the plate 36 forming capacitive network wherein the conductors 30, 52 and 32 will pass therethrough and will be electrically coupled therewith. The conductors are then wound around a common torridal core 60 to form inductor 40. The conductors are then electrically coupled to a second capacitive network 42 formed as a plate or wafer or ceramic material similar to the construction of capacitive network 36. The two capacitive networks 36 and 42 may provide high and low capacitive characteristics so that in parallel the capacitance values will provide low and high frequency filtering while passing the desired frequency band of the alternating current. The desired capacitance values for the individual capacitors in these networks can be achieved by forming a laminate construction of the dielectric material having alternating electrodes formed on the laminations. The thickness of the dielectric material between each of the electrodes will add to the capacitance value of the network, and thus the proper number of laminations will provide the desired capacitance. There are known ceramic monolithic capacitors which can be produced in this manner.

The entire protective circuit is placed in a small easily handled housing 62 having a face plate 64 provided thereon for mounting in a wall or the like. The conductors 30, 32 and 52 exit the housing 62 to be coupled to the source of AC power in a conventional manner. As seen in FIG. 4, the protective circuit arrangement may be simply provided in a plug receptacle similar to that used conventionally.

Figure 5:
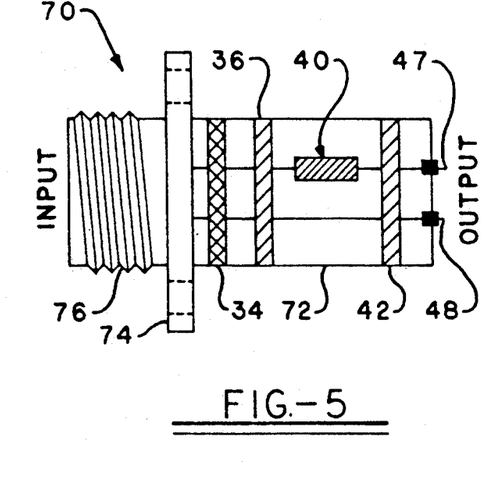
FIG. 5 shows an enlarged simplified construction for a coupling adapter usable with electrical and electromechanical devices.
Figure 6:
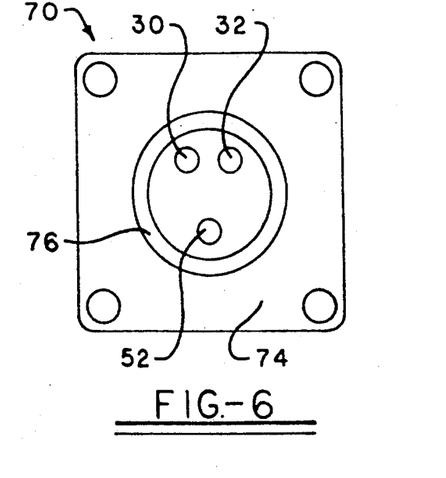
FIG. 6 is a front view of the coupling adapter shown in FIG. 5.

Turning now to FIGS. 5 and 6, a similar protective circuit construction may be utilized with a plug adapter type arrangement 70 for use with plug-in type adapters found commonly associated with computers and other electrical equipment. In this construction, the electrical device itself includes protective circuitry and reliance upon protection at the source of electrical power is not necessary. The protective circuit is similar and may include a first MOV network 34 constituting a plate or wafer of varistor material having electrodes formed on the surface thereof. A first capacitive network 36 may be utilized for filtering characteristics and coupled to the live conductors of the adapter. An inductor 40 which may comprise a printed circuit or wire wound inductor component may be coupled in series with the phase conductor of the system. A second capacitive network 42 may then placed in parallel with the first capacitive network to provide further filtering characteristics. The protective circuit arrangement is conveniently and cost effectively incorporated into a small, easily handled housing 72 having the conductors exiting therefrom for conventional coupling with the electrical device. The housing may include face plate 74 for mounting thereof and a threaded fastening member 76 to allow coupling of an outside line to the equipment. The ground terminal of the adapter 70 may be adapted to be coupled with housing 72 to provide a box ground wherein the housing 72 will itself be grounded. It should be recognized that the embodiments shown are merely examples of the potential applications of the protective circuit arrangement as described herein. For example, the circuit components can be utilized individually or in combination to provide surge protection and/or filtering characteristics. Essentially, any time a power receptacle or input/output terminal forms part of an electrical device, the circuit arrangement could be used.

Figure 7A:
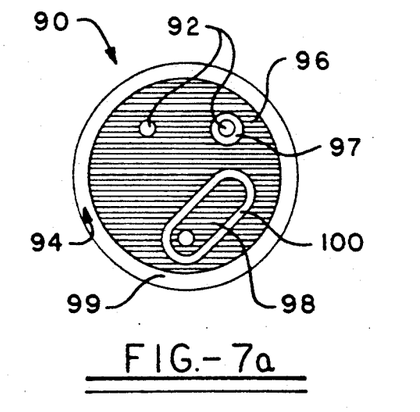
FIGS. 7a and 7b show the electrode patterns formed on two cooperating disks or wafers which are stacked alternately in intimate contact to form a conditioning circuit component in accordance with the invention. The electrode patterns for each disk may be formed on one or both sides of the disks.
Figure 7B:
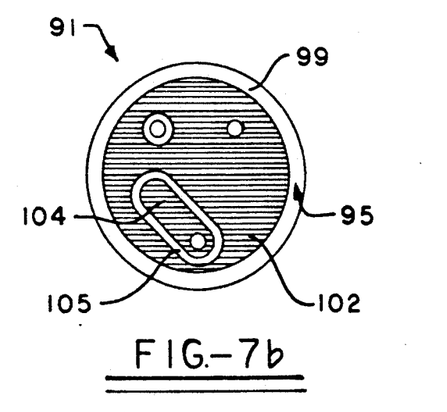

Turning now to FIGS. 7a and 7b, there is shown the electrode patterns for disk components which are assembled alternately, either as a disk having an electrode pattern on both sides, or as a plurality of disks having an electrode pattern on a single side thereof, with the plurality of disks stacked and fired as a monolithic assembly, wherein the electrode pattern on any disk fuses to it and to the adjacent disk in the stack. The resulting line conditioning component is usable as a MOV circuit component 34 and/or capacitive networks 36 and 42 as shown in the embodiments of FIGS. 3-6. For use as a surge protection circuit, a stack of alternated wafers of material 90 such as an MOV or other similar material is constructed having thicknesses in accordance with any possible transients in a particular application. In FIG. 7a, a first surface 94 of the wafer 90 shows the electrode pattern formed thereon with three apertures 92 formed therethrough wherein electrical conductors will be electrically coupled. The electrode pattern formed on the first surface 94 of wafer 90 includes a first common electrode 96 electrically connected to at least one of the apertures 92, the coupling locations for the conductors in a circuit arrangement. A second electrode 98 formed on surface 94 has an insulating band 100 therearound to electrically isolate the first and second electrodes 96 and 98. An insulating band 97 is also formed around one of the apertures 92 so as not to electrically connect the electrode to any conductor at this point. An insulating band 99 is also formed about the periphery of the wafer 90 such that the conductors of a plug or adapter type electrical component may be coupled to the ground circuit internally. The pattern on the face 94 of disk 90 thus described consists of two isolated electrodes, each connected to one of the apertures 92 which may receive through conductors therein. The electrodes formed on the wafer 90 as shown in FIG. 7a may be described as two separate half capacitors. The other halves of the capacitors will be the conductive patterns formed on the back or obverse surface of disk 90, by means of two possible methods. These methods may include forming the electrode pattern of FIG. 7a on the obverse surface of the disk 90 or alternatively providing a disk 91 as shown in FIG. 7b including the electrode pattern as shown formed on a first surface thereof which may be placed behind the disk 90 as shown in FIG. 7a such that its electrode pattern will be common to the obverse surface of the disk 90. In this method, the surface of disk 91 including the electrode pattern will be in intimate contact with the disk 90 either by soldering or after the monolithic firing fuses the electrode patterns on disk 91 to both disks 90 and 91. The electrode pattern on the disk 91 as seen in FIG. 7b includes a large, nearly complete circular electrode pattern 102 which will cooperate with electrode 96 formed on wafer 90 as seen in FIG. 7a to form a capacitor whose plates correspond to capacitor 37 of FIG. 2, connected between the phase and neutral leads 30 and 32 respectively. The small top surface electrode 98 formed on wafer 90 as seen in FIG. 7a will cooperate with a similarly shaped but slightly larger area of the electrode pattern 102 formed on wafer 91 as seen in FIG. 7b to form a capacitor corresponding to the capacitor 39 of FIG. 2, connected between the ground and neutral leads 52 and 32 respectively. A third capacitor is formed by the electrode 104 formed on wafer 91 as seen in FIG. 7b and a similarly shaped, although slightly larger portion of the electrode 96 as seen in FIG. 7a which will correspond to the capacitor 38 of FIG. 2 between the ground 52 and phase lead 30.

It should be apparent that a stack of plates with alternating electrode patterns of FIG. 7a and 7b may be rendered monolithic by firing, and may contain many repetitions of these three essential circuit elements, with each additional plate adding parallel elements to them such that they will be combined to form a line conditioning circuit component having a total value for an electrical parameter which is the sum of the final stack of plates including the alternating electrode patterns of FIG. 7a and 7b.

The monolithic stack of wafers may be utilized as a surge protection device if formed of an MOV or MOV-type material, with these two symmetrical patterns alternately located in the unit, or built up from individual wafers of alternating type. It must be emphasized that such wafers must have identical patterns bonded on both faces, and be stacked alternately. The circuit will act to provide differential or common mode protection as well as cross line protection for the circuit in which the stack assembly of alternating disks 90 and 91 as seen in FIG. 7a and 7b is utilized. The protective characteristics of the MOV circuit element constructed in accordance with FIG. 7a and 7b will depend upon the thickness of the wafers of MOV or MOV-type material and upon the number of them assembled into the stack, but it should be recognized that constraints are imposed by maintaining the path of least resistance for a transient current through the material rather than discharging along another path such as an insulating band. It should also be apparent that the elimination of lead lengths to electrically couple conductors to the surge protection element will result in faster clamping of a surge voltage to provide excellent response characteristics by reducing insertion loss in the circuit.

Figure 8:
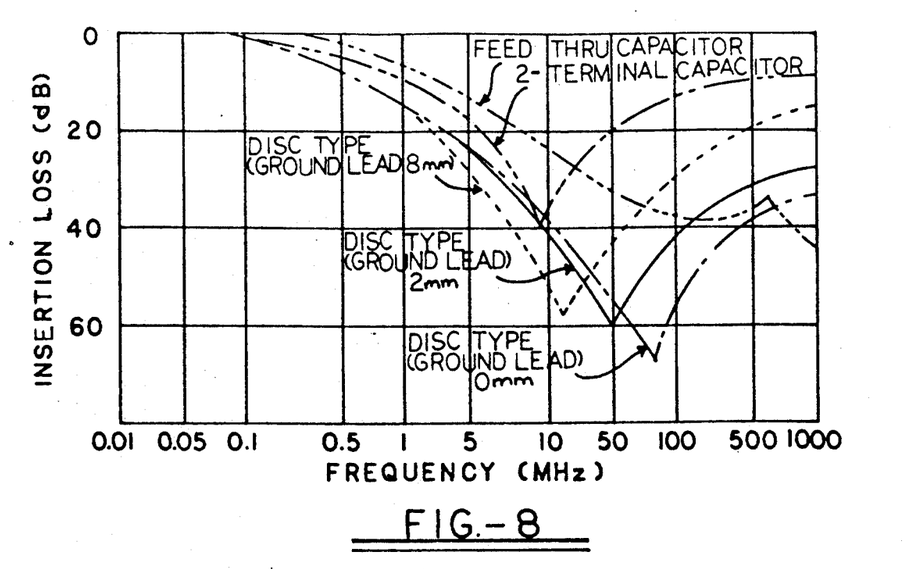
FIG. 8 shows a graph showing the change in insertion loss characteristics as grounding lead wire length is changed for some common capacitor arrangements.

As an example, the graph of FIG. 8 shows the change in insertion loss relative to frequency for a disk type three terminal capacitor relative to feed through and two-terminal capacitors. The graph displays the change in insertion loss when the grounding lead wire length is changed in the disk type three-terminal capacitor. The present invention provides a three-terminal circuit component having a higher insertion loss impedance such that its response characteristics will approach those of a feed through capacitor but having a resonance point above the resonance of a common two-terminal device. The device thus enables extremely fast clamping of surges and electromagnetic interference for common, differential or cross mode protection of sensitive electrical equipment.

Alternatively, the line conditioning circuit component composed of alternately stacked wafers as shown in FIG. 7a and 7b with the electrode patterns shown thereon may provide a capacitive network for filtering of electromagnetic and radio frequency interference. In this embodiment, the wafers 90 and 91 are made from a dielectric material, and the wafers 90 effectively have electrode patterns as shown in FIG. 7a on both front and obverse surfaces thereof. The electrode patterns on the front surface 94 may be directly applied to the wafer 90, while that on the obverse surface may have been either directly applied, or have been bonded to disk 90 by an electrode pattern similar to that shown in FIG. 7b from the front surface 95 on another disk 91 stacked in contact with the obverse surface of disk 90 before firing to make it a monolithic unit. The three capacitors thus formed share common electrodes, but are essentially connected between pairs of leads as shown in FIG. 2, and described above in connection with the MOV-type circuit component.

Figure 9A:
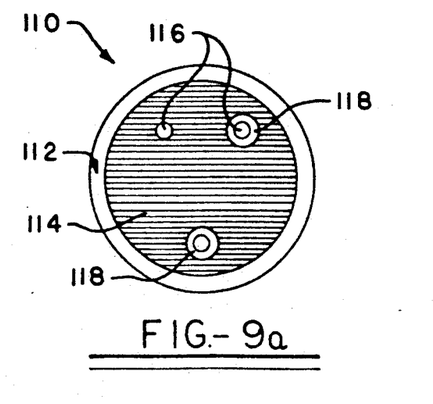
FIGS. 9a and 9b show the electrode patterns for additional wafers to vary capacitance values in a two cooperating disks which are stacked alternately in intimate contact and which may be used to produce the necessary capacitance values or line conditioning circuit formed in accordance with the present invention.

For use as a capacitive network, the embodiment of FIG. 7a and 7b will represent a series of capacitors having particular capacitance values depending upon the thickness of the dielectric material making up the wafers 90 and 91. Variation of the capacitance values may be accomplished by the addition of wafers 110 alternated with wafers 111 as shown respectively in FIGS. 9a and 9b. The wafers are of dielectric material having a predetermined thickness similar to the embodiment as shown in FIG. 7a and 7b. In FIG. 9a, an electrode pattern is shown as formed on the front surface of wafer 110. The patterns formed on its rear or obverse surface will be either a monolithic sharing of the patterns of FIG. 9b after stacking of the disks 110 and 111, or a duplicate of the electrode pattern as shown in FIG. 9a if the individual disks are used.

Figure 9B:
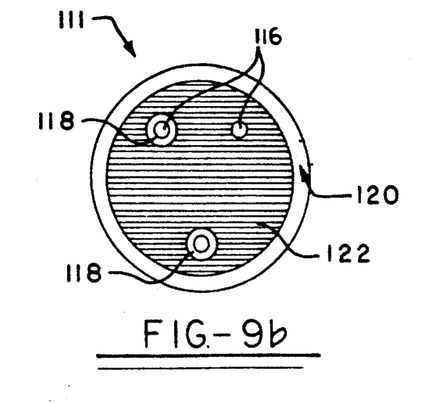

In FIG. 9a, the front and obverse surfaces 112 may have a first electrode pattern 114 formed around a plurality of apertures 116. The electrode 114 is electrically coupled to one of the apertures 116 to enable electrical connection with a conductor positioned therethrough. The other apertures 116 are provided with insulating bands 118 formed therearound to provide an electrical path which presents higher resistance than an electrical path through the dielectric material of wafer 110. The obverse surface of wafer 110 has the electrode pattern 122 from the disk 111 as seen in FIG. 9b, and therefore pattern 122 has an electrical connection to a second feed-through aperture 116, and the thickness of the dielectric disk is stressed by the potential between the phase lead 30 and the neutral lead 32. In general, the capacitance of either phase or neutral conductors to the ground conductor 52 need not be as large as that between the phase and neutral conductors for effective filtering of RFI or EMI, but smaller stacks may optionally be used in parallel with capacitors 38 and 39 of FIG. 2 by threading leads 30, 52 or 32, 52 through the apertures 116 respectively.

Figure 10A:
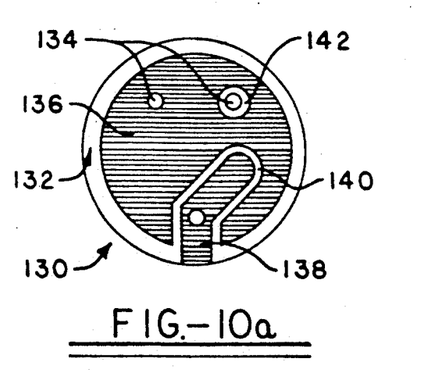
FIGS. 10a and 10b show an alternate embodiment of electrode patterns formed on two cooperating disks which are stacked alternately in intimate contact to form a line conditioning circuit component which has a peripheral ground connection.
Figure 10B:
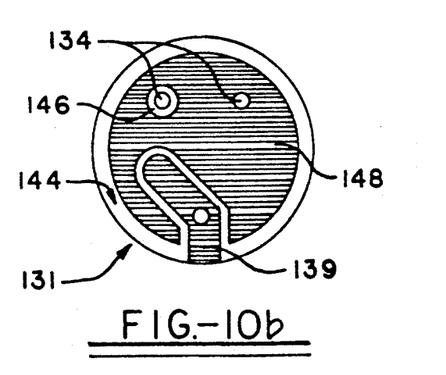

Turning now to FIGS. 10a and 10b, an alternate embodiment of the unique electrode patterns provided for a conditioning circuit component constructed of wafers of MOV or MOV-type material as well as dielectric materials to form capacitive networks are shown. In FIG. 10, as the wafer 130 includes a first surface 132 having a plurality of apertures 134 therethrough to accommodate a plurality of conductors of an electrical device. A first electrode 136 is formed on first surface 132 and is electrically coupled to one of the apertures 134 formed therein. Another electrode 138 is formed on surface 132 and is electrically coupled with another of the apertures 134 formed therein. An insulating band 140 surrounds electrode 138 and extends towards yet another of the apertures 134 formed therein. The insulating band 140 also extends about a substantial portion of the periphery of the wafer 130. There is also formed an insulating band 142 formed about one of the apertures 134 on the first surface 132 such that only two of the electrical conductors which will pass through apertures 134 formed in the wafer 130 will be electrically connected to electrodes 136 and 138 respectively. In FIG. 10b is depicted the electrode pattern applied to a second wafer 131 which is placed behind wafer 130, so that the pattern is shared by wafer 131 with the obverse side of disk 130. After monolithic firing, patterns 136 on the face of disk 130 will cooperate with pattern 148 on the obverse surface from disk 131, and correspond with capacitor 37 of FIG. 2, forming either a MOV or capacitor between leads 30 and 32 of FIG. 2, according to the type of material constituting disks 130 and 131. The electrode pattern 138 on the face of disk 130 cooperates with a portion of the pattern 148 which is essentially formed on the obverse surface by sharing with the electrode pattern applied to the face of the disk 131 as seen in FIG. 10b which was stacked behind disk 130 and fused by monolithic firing to produce a capacitor corresponding to capacitor 39 of FIG. 2, if the disks are of a dielectric material, or a corresponding portion of the MOV 35 of FIG. 2 if the material is a MOV-type. The electrode pattern 139 shared on the obverse surface of disk 130 from disk 131 will cooperate with the portion of the electrode pattern 136 formed on the front surface of disk 130 to form a capacitor corresponding to capacitor 38 of FIG. 2 if the disks are of a dielectric material, or a corresponding portion of MOV 35 as seen in FIG. 2 if the disk are of a MOV-type material. Alternate stacking of disks 130 and 131 with the electrode patterns formed thereon will increase the capacitances of the various capacitors in the capacitance networks 36 or 42 of FIG. 2 according to the total number of disks after a monolithic firing of the stack of disks. It is also possible to apply the electrode patterns as shown in FIG. 10a to both faces of disks of type 130 and stack alternately with disks of type 131 which have had the electrode pattern shown in FIG. 10b applied to both faces thereof.

In general, the monolithic firing construction is preferable to single disks having double electrodes or electrodes formed on both surfaces thereof for a number of reasons. Firstly, the final assembly with leads 30, 32 and 52 will be single unit rather a number of small fragile pieces which may crack if warping occurred during the firing of the individual pieces. Additionally, the monolithic firing seals the many insulating bands between the various electrode areas, thereby effectively excluding humidity and producing a more reliable assembly. Also in the monolithic firing construction, the electrode patterns will be required on only a single surface of each disk which shares its patterns with the preceding or succeeding one of alternate type, thus halving the work of applying the electrode patterns. It should be recognized that automation of the stacking process of unfired disks which are fed alternately to the assembly from two electrode painting machines can easily insure correct assembly, which is then sealed during the monolithic firing.

The particular advantage of the monolithic stack of disks with the electrode patterns as seen in FIGS. 10a and 10b is the fact that the electrode patterns 138 and 139 extend to the periphery of the stack, where they may make electrical contact with a ground potential sleeve surrounding the assembly. It should be evident that this construction can be used with the surge protection device if disks are of MOV-type material, and/or capacitance networks as described. As a capacitance network, the capacitance can be varied by increasing the number of alternate layers with the electrode patterns of FIGS. 10a and 10b.

Figure 11A:
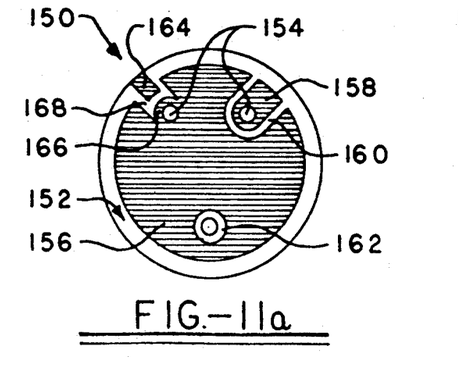
FIGS. 11a and 11b show another alternate embodiment of the electrode patterns of two cooperating disks which are stacked alternately in intimate contact for a capacitive network to provide peripheral ground in a circuit constructed in accordance with the invention.
Figure 11B:
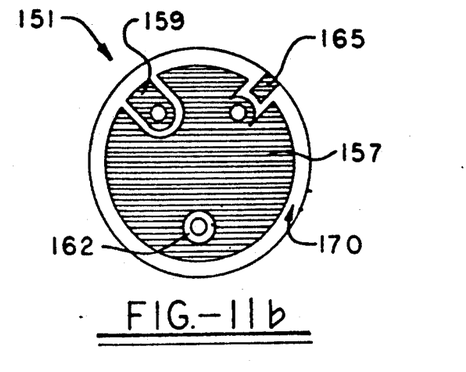

Turning now to FIGS. 11a and 11b, an alternate embodiment of the electrode patterns are shown which may be used for example to form electrode patterns on wafers of a dielectric material for a capacitance network useable with telephone line applications to reduce interference thereon. In this embodiment, a wafer of dielectric material 150 has a first surface 152 and includes a plurality of apertures 154 to accommodate electrical conductors therein. A first electrode 156 is formed on the surface 152 and is electrically coupled to one of the apertures 154 formed therein. A second electrode 158 is formed about another of the apertures 154 and is separated from electrode 156 by an insulating band 160. The third aperture 154 includes an insulating band 162 formed therearound on first surface 152. Additionally, a metal ground electrode 164 is formed relative to one of the apertures 154 so as to form a thin conductive band 166 separated from the metal ground electrode 164 by a thin insulating band 168. The insulating band 168 also extends about a substantial portion of the periphery of the wafer 150. As seen in FIG. 11b, a second disk 151 of the same material as disk 150 is provided with an electrode pattern which is a mirror image of the electrode pattern on disk 150 which is designed to be placed behind disk 150, so that the electrode patterns formed on disk 151 will be shared with the obverse surface of disk 150 and by disk 151 after firing to form a monolithic block. The major electrode area 156 of the top surface of disk 150 as shown in FIG. 11a will cooperate with the major area electrode 157 formed on disk 151 and shared with the obverse surface of disk 150, corresponding to capacitor 37 of FIG. 2 between the phase and neutral leads 30 and 32 respectively. The smaller top electrode area 158 formed on disk 150 will cooperate with the ground connection pattern 165 formed on the top surface of disk 151 and shared by the obverse surface of disk 150, similar to capacitor 39 of FIG. 2. Similarly, the small electrode pattern 159 formed on the front surface of disk 151 as shown in FIG. 11b will cooperate with the ground connection electrode 164 formed on the front surface of disk 150, which will correspond to capacitor 38 of FIG. 2. These patterns function as pulse limiters if the disk 150 and 151 are of a MOV-type material and as filter circuits limiting RFI/EMI if the disks are a dielectric material. The capacitance values can of course be built up to any necessary values by extending the stack of disks having alternate electrode patterns to any necessary number of plates, as previously described.

Figure 12A:
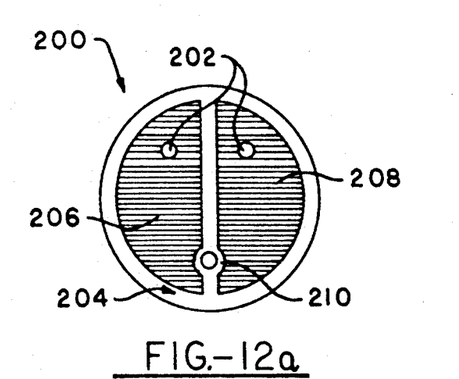
FIGS. 12a and 12b show an alternate embodiment for electrode patterns for a surge protection device usable with telecommunication systems wherein the patterns may be formed on opposed surfaces of a single disk or formed on a surface of a number of disks which are alternately stacked in intimate contact.
Figure 12B:
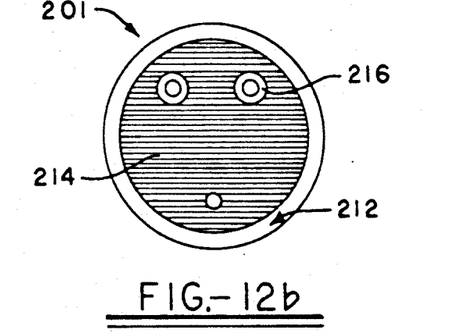

Turning now to FIGS. 12a and 12b, another embodiment of the invention shows the electrode patterning to form a surge protection circuit usable with telecommunication circuits between tip, ring and ground which have in the past required one, two or sometimes three separate varistors to achieve the balanced protection desired. Normally, telephone conductors occur in pairs in a cable such that transient voltages induced into the conductors will be common to both tip and ring conductors. If protectors across each of the conductors should break down at different overvoltages or if they respond at different times to a transient current, the transient will flow through the load causing damage to the communication circuit. The balanced protection circuit of the present invention therefore will ensure that the problem of unbalanced breakdown will not occur while not affecting normal ring voltage peaks occurring across the telephone conductors. As seen in FIG. 12a, a wafer 200 of MOV or MOV-type material has a plurality of apertures 202 therein through which telephone conductors may be positioned. The wafer of MOV material includes a first surface 204 having a first and second electrode 206 and 208 thereon, each of which is electrically connected to one of the apertures 202. A third aperture 202 is electrically insulated from the electrodes by an insulating band 210 which also extends between the electrodes and around the periphery of the wafer 200. If a single disk were to be used, which may be sufficient for a MOV-type pulse limiter, the electrode pattern of FIG. 12b would be applied to the obverse of the disk with the electrode pattern as shown in FIG. 12a on its face. But if it is desired to also limit RFI/EMI by the capacitance of the MOV or MOV-type material, the patterns would be applied to alternate disks which would be stacked and fired to a monolithic structure similar to that previously described. It should be noted that the pair of electrode patterns shown in FIGS. 12a and 12b do not limit common mode pulses to ground, such that it may be desirable to use these in conjunction with other configurations as previously described. As seen in FIG. 12b, a second surface 212 of wafer 200 includes an electrode pattern 214 formed on its surface and electrically coupled with the aperture 202 having the insulating band 210 therearound from the first surface 204. The other apertures 202 are formed with insulating bands 216 to thereby insulate electrode 214 from the conductors passing therethrough. The electrodes on the first and second surfaces 204 and 212 respectively having the MOV material positioned therebetween will function as a balanced surge protection circuit for the telephone conductors passing there through. In this way, the surge protection circuit may be used in a telecommunication circuit between tip, ring and ground wherein balanced protection for the circuit will be achieved.

Figure 13:
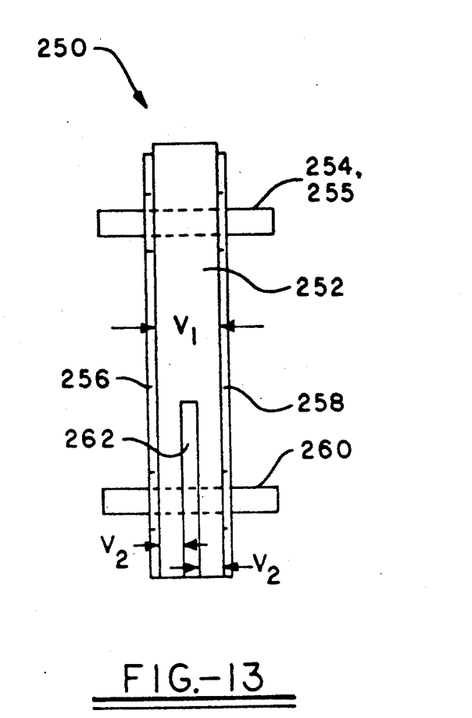
FIGS. 13 and 14 show a side and exploded view respectively of an alternate embodiment of a surge protection device in accordance with the invention.
Figure 14:
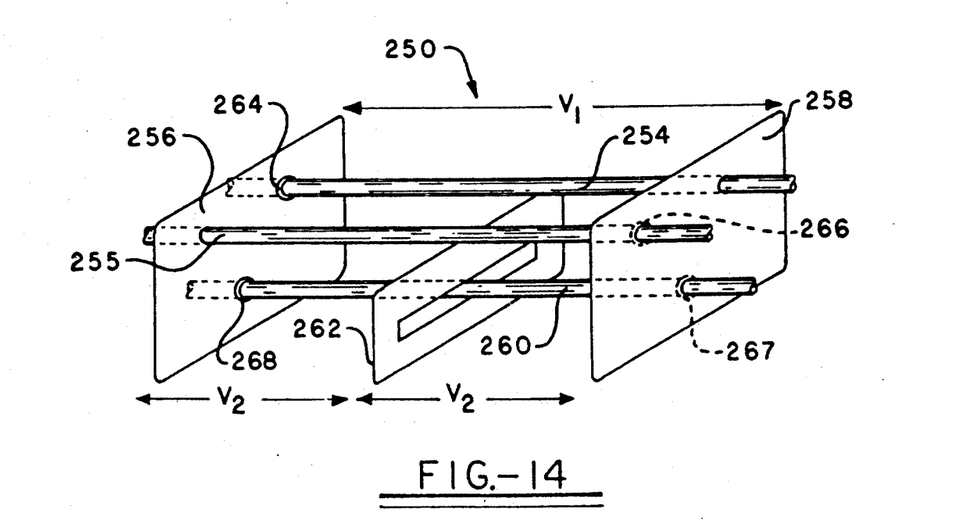

Turning now to FIGS. 13 and 14, there is shown another embodiment of the invention to provide surge protection in an electrical circuit. The device 250 includes a thickness of MOV or MOV-type material 252 which is designed to accommodate any expected overvoltages which may occur across the power and return conductors 254 and 255 in the circuit. The wafer of material 252 has first and second surfaces over which metal plates 256 and 258 are positioned. The wafer of MOV material 252 as well as the plates 256 and 258 include aligned apertures therein to allow the power and return conductors 254 and 255 as well as a ground conductor 260 to pass therethrough and to be electrically coupled to the circuit device as will be hereinafter described. At the location of the ground conductor 260, an at an intermediate location embedded within the MOV material 252, is a third electrode plate 262. The electrode plate 262 also extends upwardly within the wafer 252 toward the location of the power conductors in the circuit. As seen with reference to FIG. 14, an exploded view of the electrode plates having the conductors passing therethrough wherein the MOV or MOV-type material not shown in this Figure will be interposed between the plates as shown in FIG. 13, the electrical connections with the conductors 254, 255 and 260 are shown. To form a phase balanced circuit in accordance with the present invention, the power conductor 254 is electrically connected to the electrode plate 258 but is electrically insulated from electrode plate 256 by means of an insulating band 264 formed on plate 256 therearound. Similarly, return conductor 255 is electrically insulated from electrode plate 258 by an insulating band 266 but is electrically coupled with plate 256. The ground conductor 260 is electrically insulated from each of the plates 256 and 258 by means of insulating bands 267 and 268. The ground conductor 260 is electrically coupled to the electrode plate 262 to form a common ground in the circuit discharging through the MOV or similar type material formed between plates 256 and 258.

The device as shown in FIGS. 13 and 14 represents a phase balanced device which provides surge protection and alleviates the problem of unbalanced breakdown in the circuit. It should be recognized that the device as shown in FIG. 13 is very small and compact and is easily positioned over electrical conductors of a circuit to provide surge protection thereto. It should also be recognized that the electrode arrangement in association with a wafer of MOV or similar material provides a simply manufactured device having an ideal electrode arrangement which eliminates lead lengths and provides better operating characteristics. As an example, when the potential across the power and return conductors 254 and 255 is a voltage V1, and the potential between these conductors and ground is a voltage V2 being approximately half of the voltage V1, by interposing the electrode plate 262 half way between electrode plates 256 and 258 in the wafer 252, a phase balanced device is easily and economically achieved as only half of the thickness of MOV material is disposed between plates 256 and 258 relative to plate 262 to accommodate the voltage V2 as desired. It is of course recognized that the configuration or location of plate 262 could be modified to reflect the relationship between voltages V1 and V2.

Although the principles, preferred embodiments and preferred operation of the present invention have been described in detail herein, this is not to be construed as being limited to the particular illustrative forms disclosed. It will thus become apparent to those skilled in the art that various modifications of the preferred embodiments herein can be made without departing from the spirit or scope of the invention as defined by the appended claims.

What is claimed is:

1. A line conditioning electrical circuit component for use with an electrical device comprising,
   at least one wafer of material having predetermined electrical properties, with first and second opposed surfaces and a plurality of apertures extending through said wafer to receive electrical conductors of said electrical device,
   first and second electrode patterns formed on said first and second opposed surfaces respectively with individual electrodes of each of said first and second electrode patterns being electrically connected to at least one of said electrical conductors of said electrical device at the location of said apertures, wherein said individual electrodes of said first electrode pattern cooperate with individual electrodes of said second electrode pattern, and in conjunction with said material of said wafer form a plurality of line conditioning electrical elements acting between said electrical conductors, and at least one individual electrode of at least one of said first and second electrode patterns forming a common electrode for at least two of said line conditioning electrical elements, whereby a balanced line conditioning circuit component is formed.

2. An electrical circuit component as in claim 1, wherein,
said at least one wafer of material is constructed of a dielectric material, and said plurality of circuit elements formed by said first and second electrode patterns in conjunction with said dielectric material are capacitors forming a capacitance network usable as a filter for interference generated over said electrical conductors.

3. An electrical circuit component as in claim 2, wherein,
said thickness of said wafer of dielectric material determines the capacitance values for individual capacitors formed by said first and second electrode patterns in conjunction with said dielectric material.

4. An electrical circuit component as in claim 1, wherein,
said at least one wafer of material is constructed of an MOV-type material, and said plurality of circuit elements formed by said first and second electrode patterns on said at least one wafer in conjunction with said MOV-type material are capacitors which provide filtering until said MOV-type material goes conductive wherein said plurality of circuit elements become surge protection elements providing protection against transient current surges or overvoltages.

5. An electrical circuit component as in claim 4, wherein,
said predetermined uniform thickness of said wafer constructed of an MOV-type material determines the amount of capacitance and surge protection provided by said circuit elements.

6. An electrical circuit component as in claim 1, wherein,
said first and second electrode patterns are reverse images of one another as viewed through said at least one wafer of material.

7. An electrical circuit component as in claim 1, wherein,
individual electrodes forming said first and second electrode patterns are insulated from one another by means of insulating bands formed on said first or second surfaces of said wafer or at the location of said apertures wherein said insulating bands provide an electrical path which presents higher resistance than an electrical path through the material from which said at least one wafer is constructed.

8. An electrical circuit component as in claim 1, wherein,
said plurality of conductors include supply, neutral and ground conductors wherein three of said apertures are provided in said at least one wafer to accommodate said electrical conductors, and one individual electrode of said first and second electrode patterns is electrically coupled to one of said supply or neutral conductors and to said ground conductor respectively.

9. An electrical circuit component as in claim 8, wherein,
said electrode of said first and second electrode patterns which is electrically connected to said ground conductor extends toward one of the apertures which accommodates said supply or neutral conductors so as to form a shortened electrical path between said electrode and one of said supply or neutral conductors.

10. An electrical circuit component as in claim 1, further comprising,
an insulating band surrounding said first and second electrode patterns on the periphery of said at lest one wafer so as to electrically isolate said first and second electrode patterns on said first and second surfaces of said at least one wafer.

11. An electrical circuit component as in claim 1, further comprising,
a third electrode formed in conjunction with said first and second electrode patterns which is a common electrode in said first and second electrode patterns and extends about the periphery of said at least one wafer to provide a ground electrode which will be directly electrically connected to ground external to said electrical circuit component.

12. An electrical circuit component as in claim 1, further comprising,
a third electrode pattern associated with said at least one wafer of material and disposed between said first and second electrode patterns within said wafer of material wherein said third electrode pattern is electrically connected to at least one of said plurality of electrical conductors.

13. A line conditioning electrical circuit component for use with an electrical device comprising,
at least one first wafer of material having predetermined electrical properties, with first and second opposed surfaces and a plurality of apertures extending through said first wafer to receive electrical conductors of said electrical device,
a first electrode pattern formed on said first surface of said first wafer with individual electrodes of said first electrode pattern being electrically connected to at least one of said electrical conductors of said electrical device at the location of said apertures,
at least one second wafer of material having said predetermined electrical properties, with first and second opposed surfaces and a plurality of apertures extending through said second wafer corresponding to said apertures of said first wafer to receive electrical conductors of said electrical device,
a second electrode pattern formed on said first surface of said second wafer with individual electrodes of said second electrode pattern being electrically connected to at least one of said electrical conductors of said electrical device at the location of said apertures,
said at least one second wafer being stacked adjacent said second surface of said at least one first wafer, wherein said second electrode pattern formed on said at least one second wafer will be associated with said second surface of said at least one first wafer and individual electrodes of said first electrode pattern cooperate with individual electrodes of said second electrode pattern, such that in conjunction with said material of said wafer, there is formed a plurality of line conditioning electrical elements acting between said electrical conductors, and at least one individual electrode of each of said first and second electrode patterns forms a common electrode for at least two of said line conditioning electrical elements, whereby a balanced line conditioning circuit component is formed.

14. An electrical circuit component as in claim 13, wherein,
a plurality of first and second wafers are stacked in alternating relationship to one another such that individual electrodes of said first and second electrode patterns of each adjacent alternating first and second wafers cooperate to form said line conditioning electrical elements.

15. An electrical circuit component as in claim 14, wherein,
said material is a dielectric material, wherein said line conditioning electrical elements are capacitors forming a capacitance network usable as a filter for interference generated over said conductors and the thickness of the stacked first and second wafers determines the capacitance values of said capacitors.

16. An electrical circuit arrangement including line conditioning circuit to provide conditioning for a plurality of electrical conductors comprising;
a plurality of electrical conductors coupled to a source of current and to a load energized by said current having at least one line conditioning circuit component which is electrically connected in series with said plurality of conductors between said load,
said at least one line conditioning circuit component comprising at least one wafer of material with predetermined electrical properties having a predetermined thickness and first and second opposed surfaces, said wafer having a plurality of apertures therethrough to accommodate said plurality of electrical conductors, and first and second electrode patterns formed on said first and second surfaces respectively wherein individual electrodes of said first and second electrode patterns are electrically connected to at least one of said plurality of electrical conductors at the location of said apertures and cooperate with individual electrodes of the other electrode pattern in conjunction with the material making up said at least one wafer to provide common electrodes for a plurality of electrical circuit components and form a balanced line conditioning circuit arrangement for said plurality of electrical conductors.

17. An electrical circuit arrangement as in claim 16, wherein,
said at least one line conditioning circuit component includes a surge protection component and filter component wherein said surge protection device includes said at least one wafer which is constructed of an MOV-type material and said filter comprises at least one wafer constructed of a dielectric material to provide surge protection and filtering of electromagnetic interference occurring over said plurality of electrical conductors.

18. An electrical circuit arrangement as in claim 16, wherein,
said at least one line conditioning circuit component is electrically connected to said plurality of electrical conductors by positioning said conductors through said apertures and forming an electrical connection between said plurality of conductors and one of said first and second electrode patterns so as to incorporate said at least one line conditioning circuit component into said electrical circuit without the use of leads forming an electrical connection therebetween.

19. An electrical circuit arrangement as in claim 16, wherein,
said at least one line conditioning circuit component is a surge protection device wherein said at least one wafer of material is constructed of an MOV-type material to provide balanced surge protection for said plurality of electrical conductors.

20. An electrical circuit arrangement as in claim 16, wherein,
said at least one line conditioning circuit component is a filter for interference occurring over the said plurality of electrical conductors wherein said at least one wafer of material is constructed of a dielectric material and said line conditioning circuit component comprises a capacitance network.

* * * * *